Figure 1:
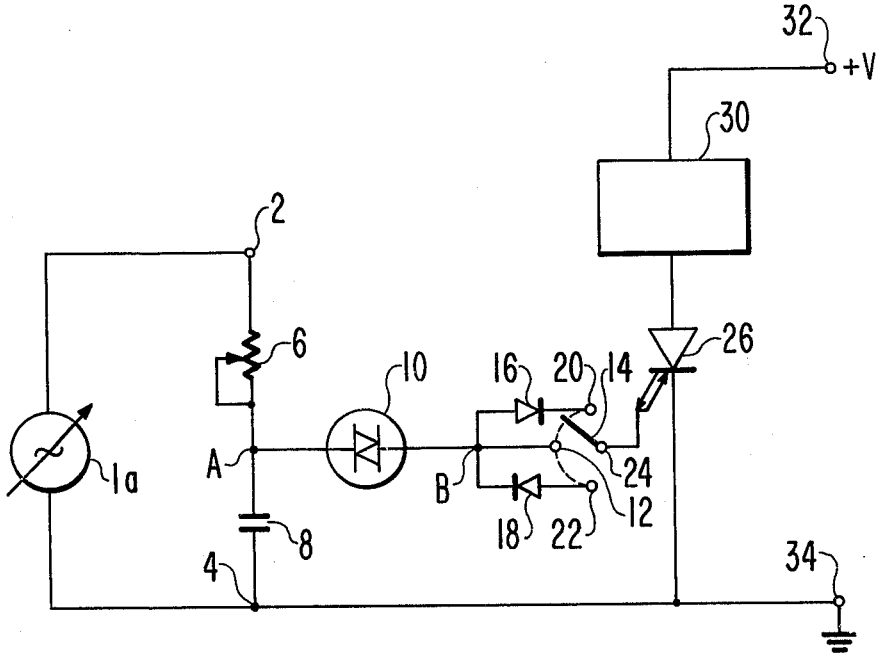
Figure 2:
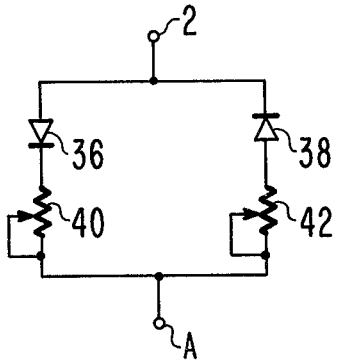

United States Defensive Publication [19] (H) [11] T958,008

Petrizio [43] May 3, 1977

[54] SWITCHING CIRCUIT

[75] Inventor: Cesare James Petrizio, Flanders, N.J.

[73] Assignee: RCA Corporation

[21] Appl. No.: 698,928

[22] Filed: June 23, 1976

[51] Int. Cl.[2] ..... G05F 3/08

[52] U.S. Cl. ..... 323/19; 307/252 C; 323/22 SC; 323/39

[57] ABSTRACT

A gate-turn off silicon controlled rectifier (GTO) is operated by selectively applying to the gate electrode thereof one of: (a) pulses of a polarity to turn on the GTO, (b) pulses of opposite polarity to turn off the GTO, and (c) pulses of alternating polarity to successively turn the GTO on and off. The pulses are derived from a circuit which includes a capacitor, an AC source for charging the capacitor in opposite senses, a diac circuit responsive to a charge of greater than a given amplitude, in either sense, stored in the capacitor, and a switch circuit for selecting from among the pulses produced by the diac circuit one of *a*, *b* and *c*.

15 Claims, 1 Sheet Drawing,

14 Pages Specification

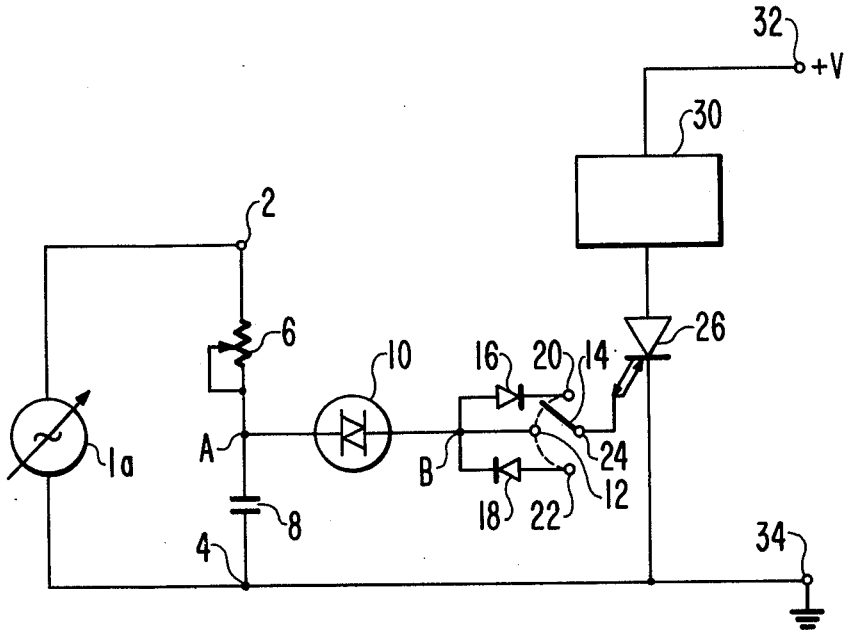

The file of this unexamined application may be inspected and copies thereof may be purchased (849 O.G. 1221, Apr. 9, 1968).